United States Patent
Wang et al.

(10) Patent No.: US 12,364,080 B2
(45) Date of Patent: Jul. 15, 2025

(54) DISPLAY PANEL, DISPLAY DEVICE AND TILED DISPLAY APPARATUS

(71) Applicants: BOE MLED Technology Co., Ltd., Beijing (CN); BOE TECHNOLOGY GROUP CO., LTD., Beijing (CN)

(72) Inventors: Lili Wang, Beijing (CN); Sha Feng, Beijing (CN); Chao Liu, Beijing (CN); Chuhang Wang, Beijing (CN); Jing Wang, Beijing (CN); Mingming Jia, Beijing (CN); Huan Wang, Beijing (CN); Qi Qi, Beijing (CN); Ming Zhai, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/927,058

(22) PCT Filed: Oct. 22, 2021

(86) PCT No.: PCT/CN2021/125921
§ 371 (c)(1),
(2) Date: Nov. 22, 2022

(87) PCT Pub. No.: WO2023/065369
PCT Pub. Date: Apr. 27, 2023

(65) Prior Publication Data
US 2025/0081695 A1 Mar. 6, 2025

(51) Int. Cl.
*H10H 20/857* (2025.01)
*H01L 25/075* (2006.01)
(52) U.S. Cl.
CPC ....... *H10H 20/857* (2025.01); *H01L 25/0753* (2013.01)

(58) Field of Classification Search
CPC . H10H 20/857; H01L 25/0753; H01L 25/075; G06F 1/1601; G06F 3/1446; G09F 9/33; H10D 86/451; H10D 86/443
See application file for complete search history.

(56) References Cited

U.S. PATENT DOCUMENTS

| | | | |
|---|---|---|---|
| 2019/0326326 A1 | 10/2019 | Seo et al. | |
| 2020/0135126 A1 | 4/2020 | Yokoyama et al. | |

(Continued)

FOREIGN PATENT DOCUMENTS

| | | | |
|---|---|---|---|
| CN | 206282855 U | 6/2017 | |
| CN | 110428739 A | 11/2019 | |

(Continued)

OTHER PUBLICATIONS

PCT International Search Report (w/ English translation) and Written Opinion for corresponding PCT Application No. PCT/CN2021/125921, mailed Jul. 27, 2022, 12 pages.

(Continued)

*Primary Examiner* — Victor A Mandala
(74) *Attorney, Agent, or Firm* — Dority & Manning, P.A.

(57) ABSTRACT

A display panel includes a backplane, back traces, side traces and blocking portions. The backplane includes a display surface, a non-display surface, and side surfaces connected to the two surfaces, where a side surface is a selected side surface. The back traces and the blocking portions are arranged on the non-display surface. Each back trace includes a first line segment and a second line segment, whose extension directions intersect. The side traces are arranged on the selected side surface. Of each side trace, an end is on the display surface, and the other end is on the non-display surface. Each side trace is electrically connected to a first line segment in a respective back trace, where the first line segment has the same extension direction as the (Continued)

other end of each side trace. Two adjacent first line segments are provided with a blocking portion therebetween.

20 Claims, 15 Drawing Sheets

(56) References Cited

U.S. PATENT DOCUMENTS

| | | |
|---|---|---|
| 2020/0150479 A1 | 5/2020 | Kim et al. |
| 2020/0161412 A1* | 5/2020 | Lin .................. H10K 77/111 |
| 2020/0176518 A1 | 6/2020 | Cho |
| 2020/0211941 A1* | 7/2020 | Xi .................... H10H 29/142 |
| 2020/0251539 A1 | 8/2020 | Fu |
| 2020/0312939 A1 | 10/2020 | Cheon et al. |
| 2021/0399185 A1 | 12/2021 | Liu et al. |
| 2022/0052241 A1* | 2/2022 | Lu .................... H10H 29/142 |
| 2022/0302362 A1 | 9/2022 | Gong et al. |
| 2023/0207733 A1* | 6/2023 | Gong ................ H10H 20/01 257/79 |
| 2024/0258477 A1* | 8/2024 | Feng ................. H10H 20/857 |

FOREIGN PATENT DOCUMENTS

| | | |
|---|---|---|
| CN | 212256800 U | 12/2020 |
| CN | 212810308 U | 3/2021 |
| CN | 113437025 A | 9/2021 |
| CN | 214624275 U | 11/2021 |
| KR | 20190044016 A | 4/2019 |
| TW | 202137597 A | 10/2021 |
| WO | WO2020166986 A1 | 8/2020 |

OTHER PUBLICATIONS

Taiwanese Office Action (w/ English translation) for corresponding TW Application No. 111140128, dated Dec. 9, 2022, 7 pages.
Taiwanese Notification to Grant Patent Right (w/ English translation) for corresponding TW Application No. 111140128, dated May 4, 2023, 8 pages.

* cited by examiner

DISPLAY PANEL, DISPLAY DEVICE AND TILED DISPLAY APPARATUS

CROSS-REFERENCE TO RELATED APPLICATION

This application is a national phase entry under 35 USC 371 of International Patent Application No. PCT/CN2021/125921 filed on Oct. 22, 2021, which is incorporated herein by reference in its entirety.

TECHNICAL FIELD

The present disclosure relates to the field of display technologies, and in particular, to a display panel, a display device and a tiled display apparatus.

BACKGROUND

As a new generation of display technology, micro light-emitting diode (Micro LED) display technology, known as the third generation of display technology, is mostly used in display devices that requires seamless tiling. The display devices may be tiled and assembled with a small distance by using a side tracing method to improve the resolution of the product.

SUMMARY

In an aspect, a display panel is provided. The display panel includes a backplane, a plurality of back traces, a plurality of side traces and a plurality of blocking portions. The backplane includes a display surface, a non-display surface, and a plurality of side surfaces connected to the display surface and the non-display surface, and a side surface of the plurality of side surfaces is a selected side surface. The plurality of back traces are arranged on the non-display surface at intervals, and each back trace includes a first line segment and a second line segment, and an extension direction of the second line segment intersects an extension direction of the first line segment. The plurality of side traces are arranged on the selected side surface at intervals, an end of each side trace is located on the display surface, and another end of each side trace is located on the non-display surface. Each side trace is electrically connected to a first line segment in a respective back trace of the plurality of back traces. An extension direction of the first line segment in the respective back trace is same as an extension direction of the another end of each side trace located on the non-display surface. The plurality of blocking portions are arranged on the non-display surface, and two adjacent first line segments is provided with a blocking portion of the plurality of blocking portions therebetween.

In some embodiments, a material of the blocking portion includes an insulation material.

In some embodiments, the material of the blocking portion includes a resin.

In some embodiments, the blocking portion is in contact with a first line segment of the two adjacent first line segments.

In some embodiments, a material of the blocking portion includes a metal material, and the blocking portion and a first line segment of the two adjacent first line segments have a distance therebetween.

In some embodiments, a ratio of the distance between the blocking portion and the first line segment adjacent thereto to a distance between the two adjacent first line segments is greater than 1:3.

In some embodiments, the material of the blocking portion includes at least one of copper, aluminum, silver and gold.

In some embodiments, a distance between a surface of the blocking portion away from the non-display surface and the non-display surface is greater than a distance between a surface of the first line segment away from the non-display surface and the non-display surface.

In some embodiments, the distance between the surface of the blocking portion away from the non-display surface is 0.4 µm to 0.6 µm greater than the distance between the surface of the first line segment away from the non-display surface and the non-display surface.

In some embodiments, an outline of an orthographic projection of the blocking portion on the non-display surface is in a shape of a rectangle, a square, a trapezoid, or a triangle.

In some embodiments, the display panel further includes a plurality of isolation portions arranged on the non-display surface. The another end of each side trace located on the non-display surface is electrically connected to a connecting portion, proximate to the selected side surface, of the first line segment in the respective back trace. Two adjacent connecting portions of the two adjacent first line segments are provided with an isolation portion of the plurality of isolation portions therebetween, the isolation portion is made of an insulation material, and the isolation portion and a connecting portion of the two adjacent connecting portions have a distance therebetween.

In some embodiments, a ratio of the distance between the isolation portion and the connecting portion adjacent thereto to a distance between the two adjacent connecting portions is greater than 1:3.

In some embodiments, the isolation portion extends to a boundary between the non-display surface and the selected side surface.

In some embodiments, a distance between a surface of the blocking portion away from the non-display surface and the non-display surface is greater than or equal to a distance between a surface of the first line segment away from the non-display surface and the non-display surface.

In some embodiments, the blocking portion and the isolation portion located between the two adjacent first line segments are connected to each other.

In some embodiments, the blocking portion is made of an insulation material, and the blocking portion and the isolation portion that are connected to each other are of an integrated structure.

In some embodiments, a width of the blocking portion in a first direction is greater than a width of the isolation portion in the first direction, and the first direction is perpendicular to the extension direction of the first line segment.

In some embodiments, the blocking portion and the isolation portion located between the two adjacent first line segments are not in contact with each other.

In another aspect, a display device is provided, including the display panel as described above.

In yet another aspect, a tiled display apparatus is provided, including a plurality of display devices each as described above, and the plurality of display devices are tiled together.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1A:
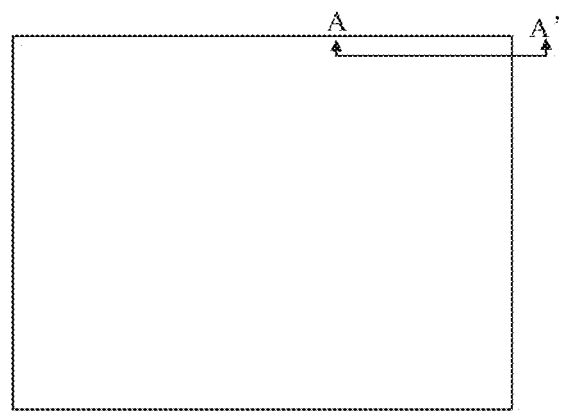
FIG. 1A is a plan view of a non-display surface of a display panel.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description of the specification, the term such as "one embodiment", "some embodiments", "exemplary embodiments", "example", "specific example" or "some examples" are intended to indicate that specific features, structures, materials, or characteristics related to the embodiment(s) or example(s) are included in at least one embodiment or example of the present disclosure. Schematic representation of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" and "second" may explicitly or implicitly include one or more of the features. In the description of the embodiments of the present disclosure, the term "a/the plurality of" means two or more unless otherwise specified.

In the description of some embodiments, the terms "connected" and derivatives thereof may be used. For example, the term "connected" may be used in the description of some embodiments to indicate that two or more components are in direct physical or electrical contact with each other. The embodiments disclosed herein are not necessarily limited to the contents herein.

The phrase "at least one of A, B and C" has same meaning as the phrase "at least one of A, B or C", both including following combinations of A, B and C: only A, only B, only C, a combination of A and B, a combination of A and C, a combination of B and C, and a combination of A, B and C.

As used herein, the terms "parallel", "perpendicular" and "equal" each include the stated situation as well as the situation similar to the stated situation. A range of the similar condition is within an acceptable deviation range, where the acceptable deviation range is determined by a person of ordinary skill in the art, considering measurement in question and errors associated with measurement of a particular quantity (i.e., limitations of a measurement system). For example, the term "parallel" includes absolute parallelism and approximate parallelism, where an acceptable range of deviation of the approximate parallelism may be, for example, a deviation within 5 degrees; the term "perpendicular" includes absolute perpendicularity and approximate perpendicularity, where an acceptable range of deviation of the approximate perpendicularity may also be, for example, a deviation within 5 degrees. The term "equal" includes absolute equality and approximate equality, where an acceptable range of deviation of the approximate equality may be, for example, a difference between two equals of less than or equal to 5% of either of the two equals.

Exemplary embodiments are described herein with reference to cross-sectional views and/or plan views as idealized exemplary drawings. In the accompanying drawings, thicknesses of layers and areas of regions are enlarged for clarity. Therefore, variations in shapes with respect to the accompanying drawings due to, for example, manufacturing technologies and/or tolerances may be envisaged. Therefore, the exemplary embodiments should not be construed as being limited to the shapes of the regions shown herein, but including deviations due to, For example, ideally, an outline of an orthographic projection of a film pattern on a certain plane has a rectangular shape. However, actually, the outline of the orthographic projection of the film pattern on a certain plane has a rounded rectangular shape, or even sides of the outline are not standard straight line segments. Therefore, the regions shown in the accompanying drawings are schematic in nature, and their shapes are not intended to show actual shapes of regions in a device, and are not intended to limit the scope of the exemplary embodiments.

Figure 1B:
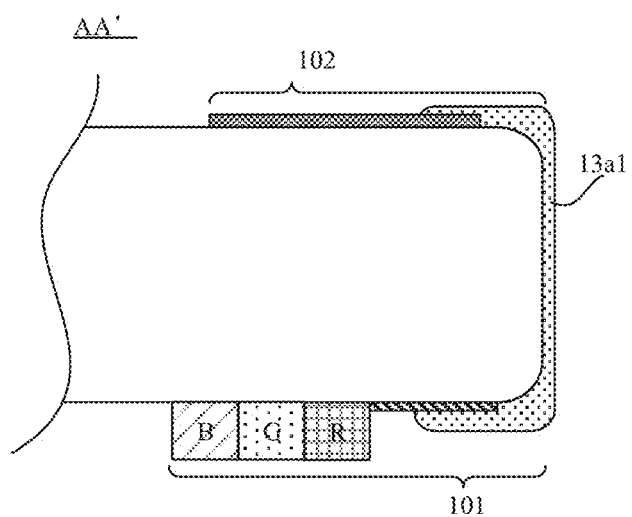
FIG. 1B is a cross-sectional structural view of the display panel along the section line AA'.

In the related art, in a single display panel, traces on a display surface of the display panel may be connected to a driver arranged on a non-display surface of the display panel through traces arranged on a side surface of the display panel. Therefore, in a case where a large-sized display apparatus is formed by tiling a plurality of display panels, distances between adjacent display panels may be small. Specifically, a metal layer may be formed on the side surface of the display panel, and then the metal layer may be etched to form a pattern of the side traces through an etching process, or the side traces may be directly formed on the display panel by using a flexible mask. As shown in FIGS. 1A and 1B, a display panel includes a pixel unit film layer located on a display surface of the display panel 10', which is represented by B, R and G in FIG. 1B. Front traces 101 include all signal lines, power lines, control lines, etc., which are all located on the display surface, and back traces 102 include conductive patterns located on a non-display surface.

Figure 2:
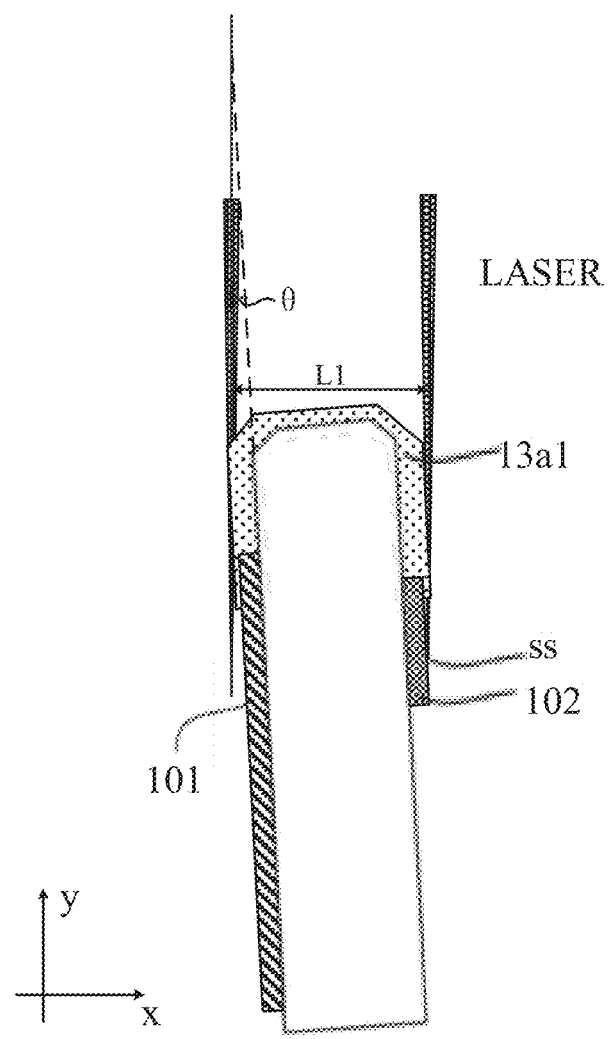
FIG. 2 is a side view of a display panel etched by laser.
Figure 3:
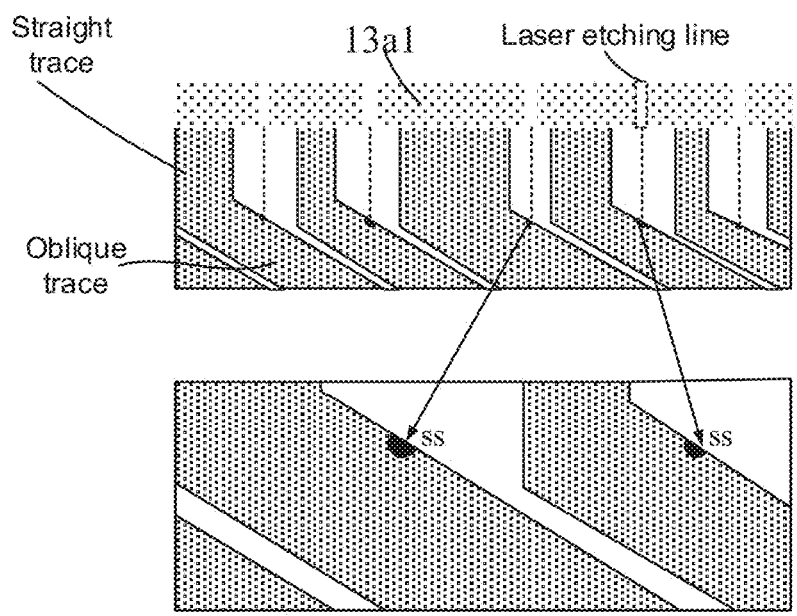
FIG. 3 is a structural diagram of a non-display surface of a display panel on which traces are damaged.

A laser etching method with a long focal depth is mainly adopted in a process of patterning the metal layer into the side traces through etching. The inventors found that in this process, if surfaces of some regions, proximate to the side traces, of film layers of the front trace and the back trace are exposed, these surfaces are inevitably irradiated by laser with the long focal depth, which will cause damage to the exposed regions of the front trace and back trace of the display panel. After a product reliability test or long-term use, a damaged position will become a corrosion-inducing point, which provides a source for a path where water and oxygen intrude, thereby causing damage for circuits. As shown in FIG. 2, an irradiation direction of the laser LASER is parallel to a y-axis, which is substantially parallel to the display surface of the display panel, and a moving path L1 of the laser is parallel to an x-axis. Considering that the display surface of the display panel 10' is provided thereon with many devices, and structures of film layers thereof are complicated, the display panel may be rotated at a certain angle during the laser etching. For example, the display surface of the display panel is set to have an included angle θ with the y-axis and an included angle (90 degrees+θ) with the x-axis, where θ is not more than 3 degrees, for example, it may be 0.8 degrees. In this way, the front trace 101 on the display surface of the display panel 10' will not be irradiated by the laser, which may prevent the front trace 101 on the display surface from being damaged and thus ensure the reliability of the display surface. However, such an arrangement will cause damage to the back trace on the non-display surface. As shown in FIG. 2, a position ss may be irradiated by the laser, and if there is a back trace pattern at the position ss, a damage point will be be formed at the position. As shown in FIG. 3, the back trace includes a straight line segment (i.e., straight trace) and an oblique line segment (i.e., oblique trace), a damage point ss will be formed at an intersection of an extension line of a laser etching line and the oblique line segment, that is, a portion of the oblique line segment adjacent to the straight line segment will be irradiated by the laser, resulting in etching damage and affecting a quality of the product.

Figure 4:
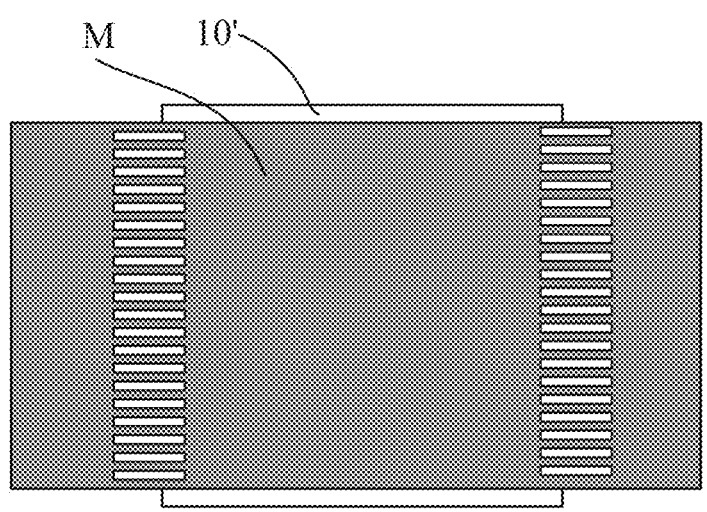
FIG. 4 is a structural diagram of side traces of a display panel formed by a flexible mask sputtering process.
Figure 5:
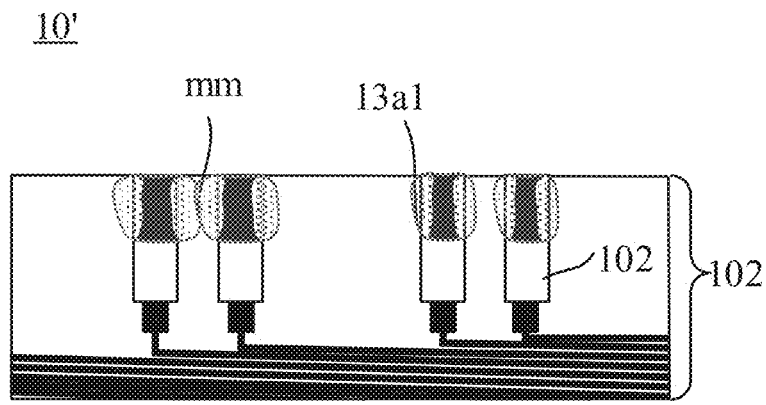
FIG. 5 is a structural diagram showing a case of a short circuit between back traces of a display panel.
Figure 6:
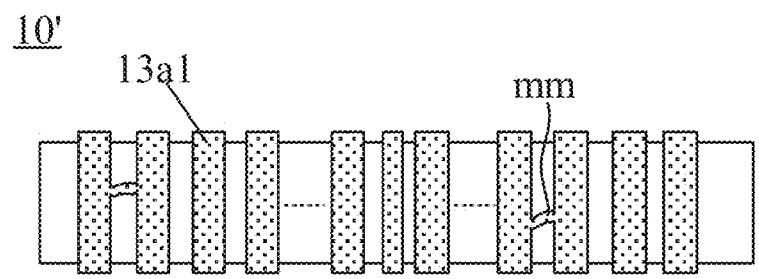
FIG. 6 is a structural diagram showing a case of a short circuit between side traces of a display panel.

The inventors further found that, in a process that the side traces 13a1 of the display panel 10' are directly formed by using the flexible mask M, as shown in FIG. 4, since the mask M cannot be tightly attached to the display panel 10', there is a gap between the mask M and the display panel. When a coating layer is formed above the mask M, the coating layer will penetrate into the gap, then extends to the display surface, the non-display surface or the side surface of the display panel 10', thereby forming conductive islands mm, as shown in FIG. 5. The conductive island mm is most likely to connect two adjacent side traces 13a1, thereby causing regions that should be insulated from each other to be connected to each other, resulting in a short circuit. For example, thicknesses of the front trace 101 and the back trace 102 of the display panel 10' are in a range of 500 to 600 nm, normally. In a case where a thickness of the conductive island reaches about 50 nm, the short circuit will occur. The short circuit condition on back traces 102 of the display panel 10' is as shown in FIG. 5. In FIG. 5, film layers with different colors and different shapes are arranged to be connected sequentially, which represent the whole back traces 102. The different shapes of the film layers represent different conductive layers, and different conductive layers are located in different layers. Adjacent conductive layers are provided with an insulation layer therebetween, and different conductive layers are electrically connected to each other through via holes. The short circuit condition on the side traces 13a1 is as shown in FIG. 6. Especially in high-resolution or small-sized display products, distances between the side traces of the display panel 10' are small, which is more likely to cause the short circuit due to the penetration of the coating layer. After the short circuit occurs, the conductive island may be etched by laser irradiation, so that a portion where the short circuit occurs may be in an open-circuit state. However, such a repairment method may also cause a problem that the laser accidentally damages normal trace patterns.

Some embodiments of the present disclosure provide a display panel 10. For example, the display panel 10 is a micro light-emitting diode (Micro LED) display panel or a mini light-emitting diode (mini LED) display panel.

Figure 7:
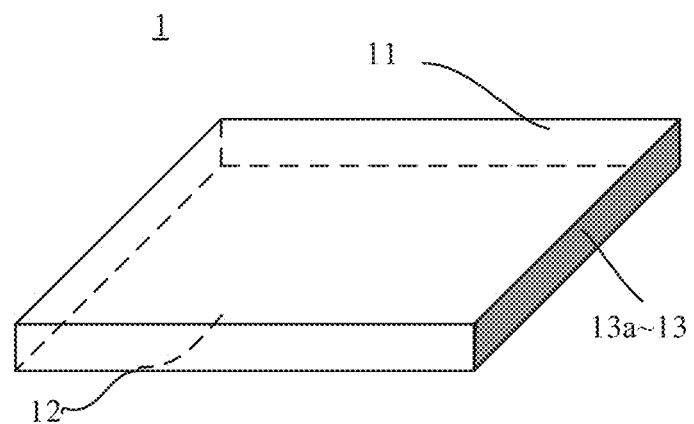
FIG. 7 is a structural diagram of a backplane, in accordance with some embodiments of the present disclosure.
Figure 9:
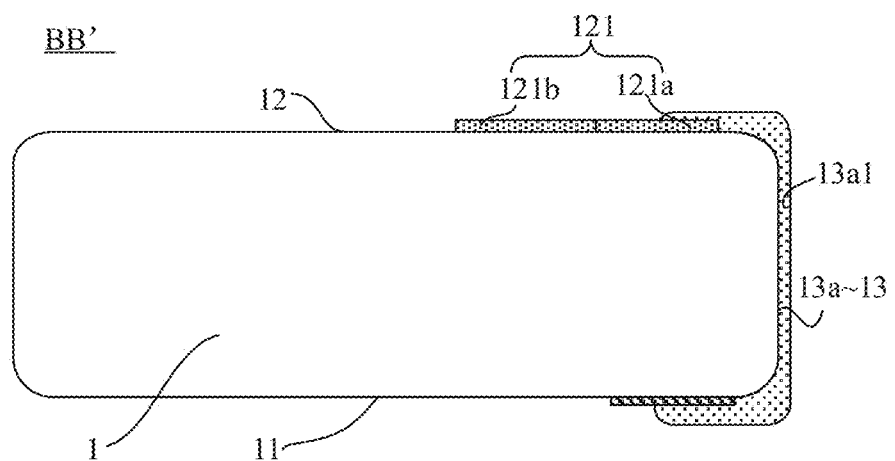
FIG. 9 is a cross-sectional structural view of the display panel along the section line BB' shown in FIG. 8B, in accordance with some embodiments of the present disclosure.

As shown in FIGS. 7 and 9, the display panel 10 includes a backplane 1, a plurality of back traces 121, a plurality of side traces 13a1 and a plurality of blocking portions 2.

As shown in FIG. 7, the backplane 1 includes a display surface 11, a non-display surface 12, and a plurality of side surfaces 13 connected to the display surface 11 and the non-display surface 12, and one of the side surfaces 13 is a selected side surface 13a.

Figure 8A:
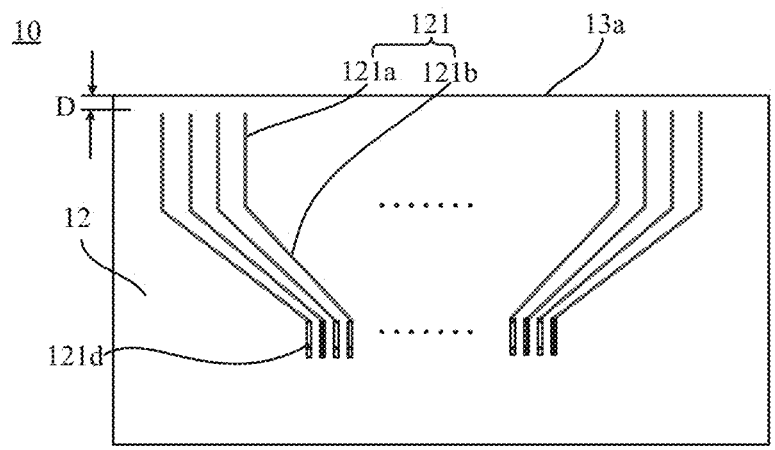
FIG. 8A is a plan structural view of a non-display surface of a display panel, in accordance with some embodiments of the present disclosure.
Figure 8B:
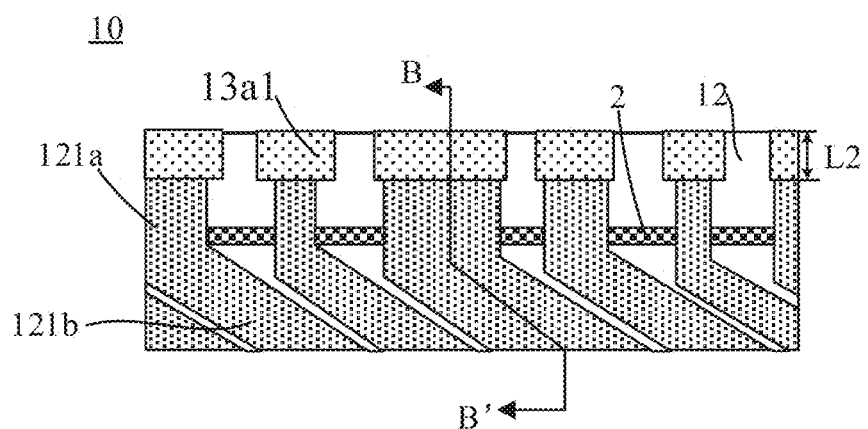
FIG. 8B is a diagram of structures on a non-display surface of a display panel, in accordance with some embodiments of the present disclosure.

As shown in FIG. 8A, the plurality of back traces 121 are arranged on the non-display surface 12 at intervals, and each back trace 121 includes a first line segment 121a and a second line segment 121b. As shown in FIGS. 8A and 8B, in some embodiments, the first line segment 121a and the second line segment 121b have an included angle therebetween, and the two are adjacent to each other. Lengths of first line segments 121a in respective extension directions may be different, and ends of the first line segments 121a connected to respective second line segments 121b may not be on a same straight line in a direction perpendicular to the extension directions of the first line segments 121a. The first line segments 121a of the plurality of back traces 121 are arranged in parallel, and the second line segments 121b of the plurality of back traces 121 are substantially arranged in parallel. Second line segments 121b of any two adjacent back traces among the plurality of back traces 121 have a substantially same distance therebetween. In addition, an end, proximate to the selected side surface 13a, of the first line segment 121a of each of the plurality of back traces 121 and the selected side surface 13a have a distance D therebetween, and the distance is greater than 0. For example, the distance D is in a range of 20 μm to 100 μm, inclusive. For example, the distance D may be 70 μm, or 80 μm.

With continuous reference to FIG. 8A, an end, away from the first line segment 121a, of the second line segment 121b of each back trace 121 is connected to a bonding terminal 121d. The bonding terminal 121d is used for connecting with an external circuit board and receiving an electrical signal output by the external circuit board.

The plurality of side traces 13a1 are arranged on the selected side surface 13a at intervals, an end of each side trace 13a1 is located on the display surface 11, and the other end thereof is located on the non-display surface 12. As shown in FIG. 9, the end of each side trace 13a1 located on the non-display surface 12 is electrically connected to a first line segment 121a. The side trace 13a1 is used to connect traces on the display surface 11 and the non-display surface 12, thereby realizing a narrow bezel of the display device. The extension direction of the first line segment 121a is the same as an extension direction of a portion (i.e., the other end) of the side trace 13a1 located on the non-display surface 12. The extension direction of the second line segment 121b intersects the extension direction of the first line segment 121a. With continuous reference to FIG. 8B, the extension direction of the first line segment 121a located on the non-display surface 12 is the same as the extension direction of the portion of the side trace 13a1 located on the non-display surface 12, so that the end of the side trace 13a1 laps with the end of the first line segment 121a. A length L2 of the portion of the side trace 13a1 located on the non-display surface 12 is slightly greater than the distance D. For example, the length L2 may be 200 μm, which ensures a reliable connection between the side trace 13a1 and the corresponding first line segment 121a.

Figure 10:
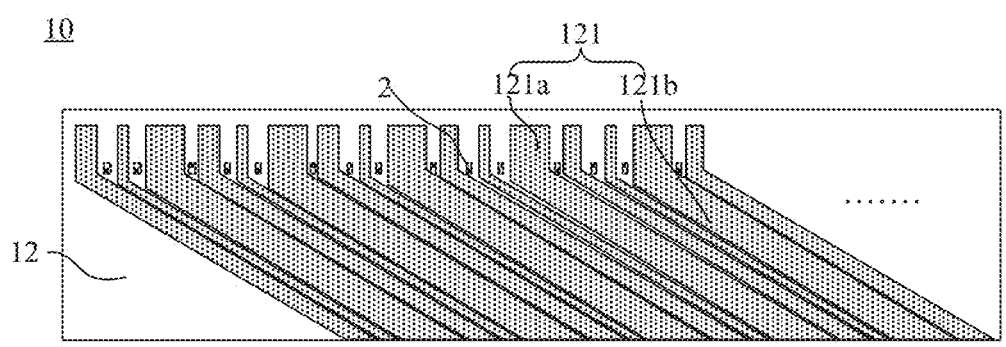
FIG. 10 is a diagram of other structures on a non-display surface of a display panel, in accordance with some embodiments of the present disclosure.

As shown in FIGS. 8B and 10, the plurality of blocking portions 2 are arranged on the non-display surface 12, and two adjacent first line segments 121a are provided with a blocking portion 2 therebetween. A blocking portion 2 is provided between every two adjacent first line segments 121a, and the blocking portion 2 is arranged beside an end of the first line segment 121a, where the first line segment 121a and the second line segment 121b are connected.

By arranging the blocking portion 2 between first line segments 121a of any two adjacent back traces 121, and the blocking portion 2 being located beside the end of the first line segment 121a away from the selected side surface 13a, when the laser is used to etch a metal layer of the side traces to be formed or a conductive island mm existing between the side traces 13a1, the blocking portion 2 can block the laser LASER. The blocking portion 2 itself may be used as a sacrificial layer for laser etching, which effectively protects the back trace 121 from etching damage caused by the laser LASER, and prevents a further corrosion on the film layers of the circuit due to the damage caused by the laser LASER. As a result, the quality of the product is improved.

In some embodiments, with continuous reference to FIG. 8B, the blocking portion 2 is made of an insulation material. For example, the blocking portion 2 may be made of resin. In a case where the blocking portion 2 is made of an insulation material, the blocking portion 2 may be in direct contact with the first line segments 121a adjacent thereto.

In some embodiments, as shown in FIG. 10, in the case where the blocking portion 2 is made of an insulating material, the blocking portion 2 may not be in contact with the first line segment 121a.

In some embodiments, an outline of an orthographic projection of the blocking portion 2 on the non-display surface 12 is in a shape of a rectangle, a square, a trapezoid, or a triangle. The shape of the outline of the orthographic projection of the blocking portion 2 on the non-display surface 12 is not specifically limited as long as the blocking portion 2 can block the laser.

Figure 11:
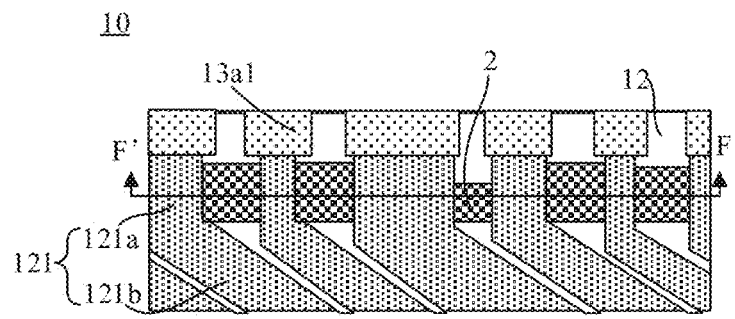
FIG. 11 is a diagram of yet other structures on a non-display surface of a display panel, in accordance with some embodiments of the present disclosure.
Figure 12:
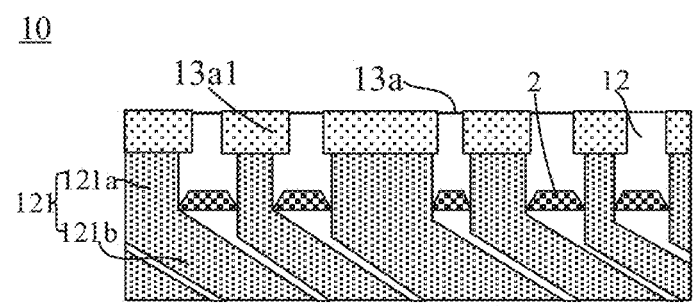
FIG. 12 is a diagram of yet other structures on a non-display surface of a display panel, in accordance with some embodiments of the present disclosure.
Figure 13:
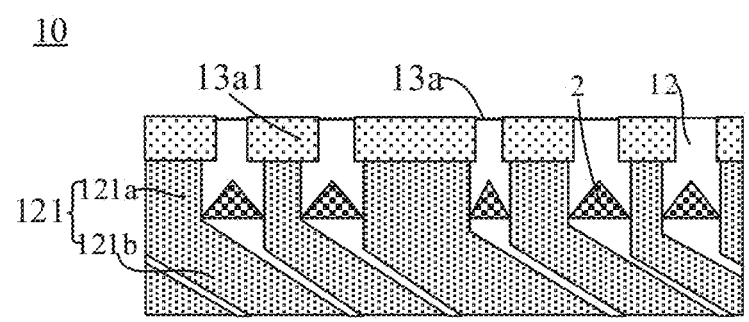
FIG. 13 is a diagram of yet other structures on a non-display surface of a display panel, in accordance with some embodiments of the present disclosure.

In some embodiments, in the case where the blocking portion 2 is made of an insulation material and is in contact with the first line segment 121a, with continuous reference to FIG. 8B, the outline of the orthographic projection of the blocking portion 2 on the non-display surface 12 is in the shape of a rectangle. As shown in FIG. 11, the outline of the orthographic projection of the blocking portion 2 on the non-display surface 12 is in the shape of a square, and two adjacent first line segments 121a may have a different distance therebetween. Therefore, for the square blocking portion 2 disposed between the two adjacent first line segments 121a, in a case where the blocking portion 2 is in contact with the two adjacent first line segments 121a, side lengths of different blocking portions 2 are different. Therefore, a size of the square blocking portion 2 that is between the two adjacent first line segments 121a and in contact with the two may be different. For example, as shown in FIG. 11, a distance between two first line segments 121a in the middle of the figure is small, so a size of a square blocking portion 2 located between the two first line segments 121a is small. As shown in FIG. 12, the outline of the orthographic projection of the blocking portion 2 on the non-display surface 12 is in the shape of a trapezoid. An upper base of the trapezoid is closer to the selected side surface 13a than a lower base thereof. Moreover, two adjacent first line segments 121a may have a different distance therebetween, therefore a size of the trapezoid blocking portion 2 that is between the two adjacent first line segments 121a and in contact with the two may be different. As shown in FIG. 13, the outline of the orthographic projection of the blocking portion 2 on the non-display surface 12 is in the shape of a triangle, where a vertex of the triangle is closer to the selected side surface 13a than an opposite side to which the vertex is opposite. The above content illustrates the shape of the outline of the orthographic projection of the blocking portion 2 on the non-display surface 12, and the shape is not limited as long as the blocking portion 2 can block the laser. It will be noted that, widths of first line segments 121a of different back traces 121 are different in a direction perpendicular to their extension directions, and the first line segments 121a of two adjacent back traces 121 may have a different distance therebetween, therefore a blocking portion 2 located between different two adjacent first line segments 121a may have a different size, but have a similar shape.

It will be noted that, in a case where the blocking portion 2 is in the shape of the trapezoid, as shown in FIG. 12, the upper base of the trapezoid is closer to the selected side surface 13a than the lower base thereof. Alternatively, the lower base of the trapezoid is closer to the selected side surface 13a than the upper base thereof. The arrangement of the trapezoid is not limited thereto. Similarly, as shown in FIG. 13, the outline of the orthographic projection of the blocking portion 2 on the non-display surface 12 is in the shape of the triangle, where the vertex of the triangle is closer to the selected side surface 13a than the opposite side to which the vertex is opposite. Alternatively, the vertex of the triangle is further away from the selected side surface 13a than the opposite side to which the vertex is opposite, which is not limited thereto, as long as the blocking portion 2 can block the laser.

In some embodiments, in a case where the blocking portion 2 is made of an insulation material and the blocking portion 2 is not in contact with the first line segment 121a, with continuous reference to FIG. 10, the outline of the orthographic projection of the blocking portion 2 on the non-display surface 12 is in the shape of a rectangle. Alternatively, the outline of the orthographic projection of the blocking portion 2 on the non-display surface 12 is in the shape of a square, a trapezoid, or a triangle, which will not be repeated here.

Figure 14:
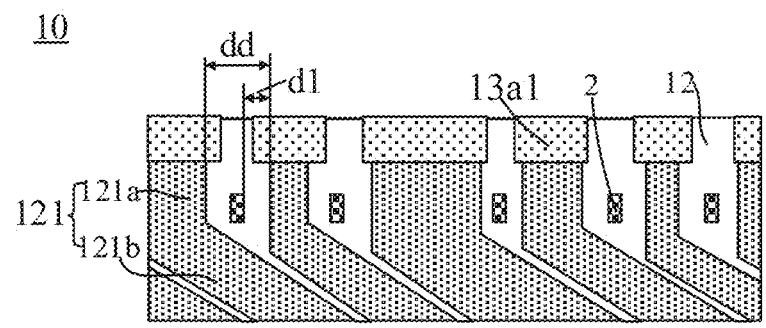
FIG. 14 is a diagram of yet other structures on a non-display surface of a display panel, in accordance with some embodiments of the present disclosure.

In some embodiments, the blocking portion 2 includes a metal material. For example, the blocking portion 2 may be made of at least one of copper, aluminum, silver, and gold. For example, the blocking portion 2 may be made of copper, or silver, or copper-aluminum alloy. As shown in FIG. 14, in the case where the blocking portion 2 is made of a metal material, in order to avoid the short circuit between back traces 121 caused by the lapping between the blocking portion 2 and the first line segments 121a, the blocking portion 2 and the first line segment 121a adjacent thereto have a distance therebetween. A ratio of the distance d1 between the blocking portion 2 and the first line segment 121a adjacent thereto to a distance dd between the two adjacent first line segments 121a corresponding to the blocking portion 2 is greater than 1:3. Here, the distance dd refers to a distance between projections of two opposite side surfaces of the two adjacent first line segments 121a on the non-display surface 12; the distance d1 refers to a distance between a projection of a side surface of the blocking portion 2 and a projection of a side surface of a first line segment 121a adjacent to the blocking portion 2 on the non-display surface 12, where the two side surfaces are opposite. With continuous reference to FIG. 14, in a case where the distance dd between the two adjacent first line segments 121a is 60 μm, the distance d1 between the blocking portion 2 and the first line segment 121 may be set to 25 μm. By setting the ratio of the distance d1 between the blocking portion 2 and the first line segment 121a adjacent thereto to the distance dd between the two adjacent first line segments 121a corresponding to the blocking portion 2 to be greater than 1:3, it can not only prevent the short circuit due to the connection of the first line segments 121a caused by the blocking portion 2, but also prevent the back traces 121 from being etched by the laser LASER.

In some embodiments, in the case where the blocking portion 2 is made of a metal material, the orthographic projection of the blocking portion 2 on the non-display surface 12 is in the shape of a rectangle, a square, a trapezoid, or a triangle.

Figure 15:
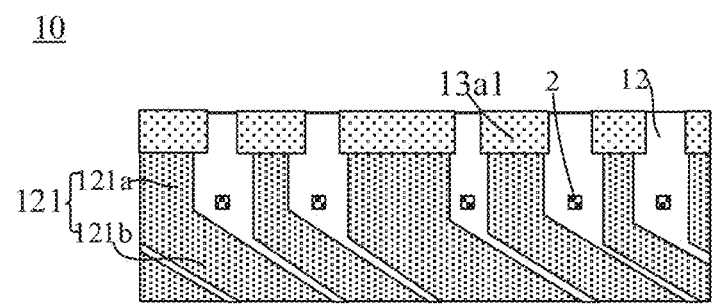
FIG. 15 is a diagram of yet other structures on a non-display surface of a display panel, in accordance with some embodiments of the present disclosure.
Figure 16:
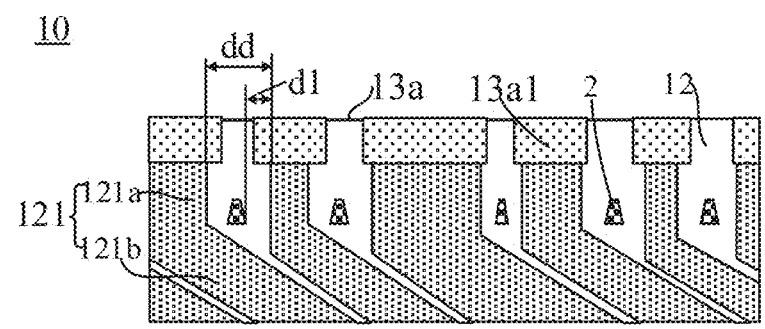
FIG. 16 is a diagram of yet other structures on a non-display surface of a display panel, in accordance with some embodiments of the present disclosure.
Figure 17:
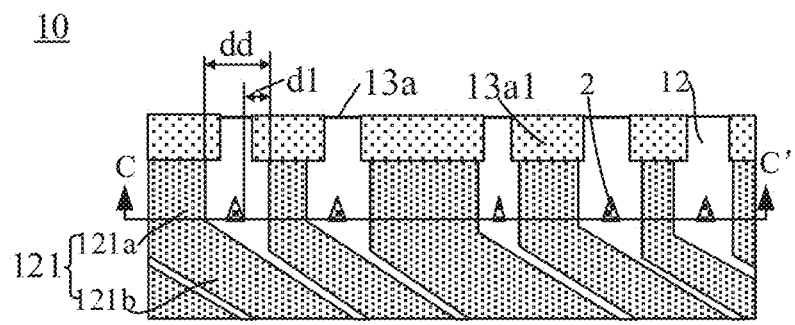
FIG. 17 is a diagram of yet other structures on a non-display surface of a display panel, in accordance with some embodiments of the present disclosure.

In some embodiments, with continuous reference to FIG. 14, in the case where the blocking portion 2 is made of a metal material, the outline of the orthographic projection of the blocking portion 2 on the non-display surface 12 is in the shape of a rectangle. As shown in FIG. 15, the outline of the orthographic projection of the blocking portion 2 on the non-display surface 12 is in the shape of a square. As shown in FIG. 16, the outline of the orthographic projection of the blocking portion 2 on the non-display surface 12 is in the shape of a trapezoid, where an upper base of the trapezoid is closer to the selected side surface 13a than a lower base thereof. As shown in FIG. 17, the outline of the orthographic projection of the blocking portion 2 on the non-display surface 12 is in the shape of a triangle, where a vertex of the triangle shape is closer to the selected side surface 13a than an opposite side to which the vertex is opposite. The above content illustrates the shape of the outline of the orthographic projection of the blocking portion 2 on the non-display surface 12, and the shape is not limited as long as the blocking portion 2 can block the laser. In this case, the distance d1 between the blocking portion 2 and the first line segment 121a adjacent thereto refers to the shortest distance between a surface of the blocking portion 2 and a surface of the first line segment 121a adjacent thereto, where the two surfaces are opposite. It will be noted that, widths of first line segments 121a of different back traces 121 are different in a direction perpendicular to respective extension directions, and first line segments 121a of two adjacent back traces 121 may have a different distance therebetween, therefore a blocking portion 2 located between different two adjacent first line segments 121a may have a different size, but have a similar shape.

Figure 18A:
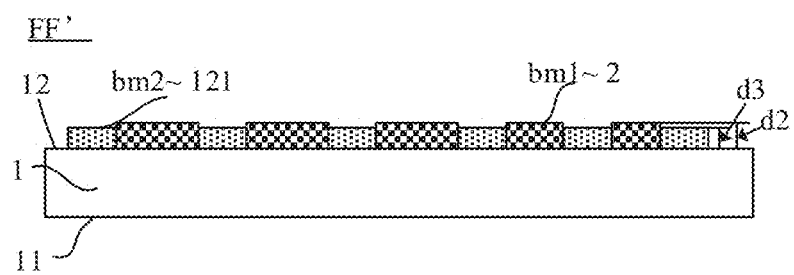
FIG. 18A is a cross-sectional structural view of the display panel along the section line FF' shown in FIG. 11, in accordance with some embodiments of the present disclosure.
Figure 18B:
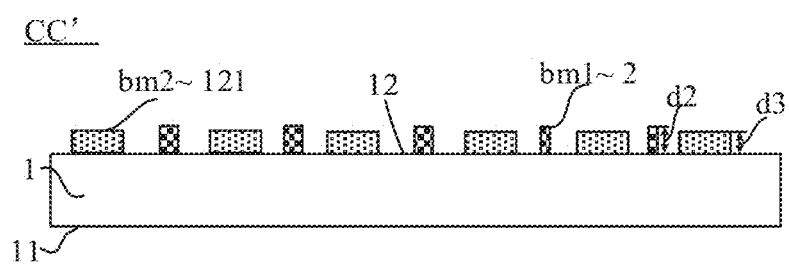
FIG. 18B is a cross-sectional structural view of the display panel along the section line CC' shown in FIG. 17, in accordance with some embodiments of the present disclosure.

In some embodiments, as shown in FIGS. 18A and 18B, a distance d2 between a surface bm1 of the blocking portion 2 away from the non-display surface 12 and the non-display surface 12 is greater than a distance d3 between a surface bm2 of the first line segment 121a away from the non-display surface 12 and the non-display surface 12.

In some embodiments, in the case where the blocking portion 2 is made of an insulation material and the blocking portion 2 is in contact with the first line segment 121a, as shown in FIG. 18A, the distance d2 between the surface bm1 of the blocking portion 2 away from the non-display surface 12 and the non-display surface 12 is 0.4 μm to 0.6 μm greater than the distance d3 between the surface bm2 of the first line segment 121a away from the non-display surface 12 and the non-display surface 12. For example, the distance d2 is 0.5 μm greater than the distance d3, or d2 is 0.6 μm greater than d3, or d2 is 0.4 μm greater than d3, which is not limited in the present disclosure.

In some embodiments, in the case where the blocking portion 2 is made of a metal material, as shown in FIG. 18B, the distance d2 between the surface bm1 of the blocking portion 2 away from the non-display surface 12 and the non-display surface 12 is 0.4 μm to 0.6 μm greater than the distance d3 between the surface bm2 of the first line segment 121a away from the non-display surface 12 and the non-display surface 12. For example, the distance d2 is 0.5 μm greater than the distance d3, or the distance d2 is 0.6 μm greater than the distance d3, or the distance d2 is 0.4 μm greater than the distance d3, which is not limited in the present disclosure.

By setting the distance d2 between the surface bm1 of the blocking portion 2 away from the non-display surface 12 and the non-display surface 12 to be 0.4 μm to 0.6 μm greater than the distance d3 between the surface bm2 of the first line segment 121a away from the non-display surface 12 and the non-display surface 12, in the entire process of patterning the metal layer into the side traces 13a1 by laser etching, or in the process of etching the conductive island mm between the side traces 13a1 by the laser, the blocking portion 2 can provide sufficient protection for the back trace 121 and thus prevent the back trace 121 from being subjected to etching damage caused by the laser.

Figure 19A:
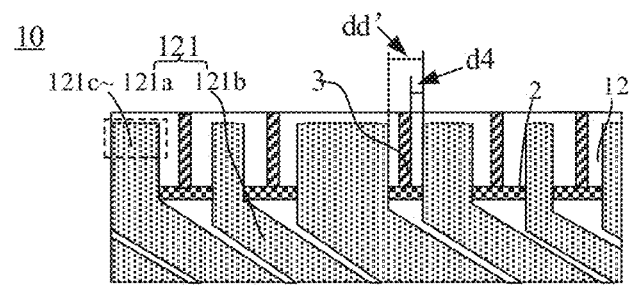
FIG. 19A is a diagram of yet other structures on a non-display surface of a display panel, in accordance with some embodiments of the present disclosure.
Figure 19B:
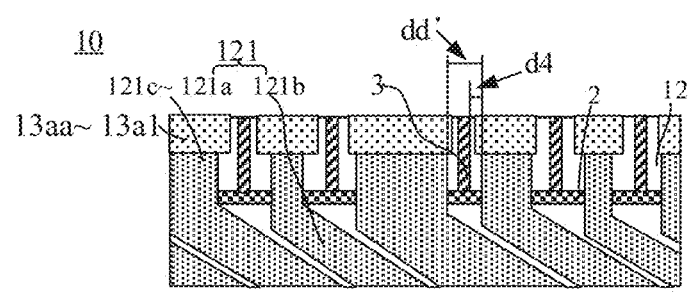
FIG. 19B is a diagram of yet other structures on a non-display surface of a display panel, in accordance with some embodiments of the present disclosure.

In some embodiments, as shown in FIGS. 19A and 19B, the display panel 10 further includes a plurality of isolation portions 3 arranged on the non-display surface 12. An end of a first line segment 121a proximate to the selected side surface 13a is used for lapping with an end 13aa of a side trace 13a1 located on the non-display surface 12. The end of the first line segment 121a proximate to the selected side surface 13a is called as a connecting portion 121c. It can be understood that, the connecting portion 121c is a portion of the first line segment 121a, and each first line segment 121a is electrically connected to an end 13aa of a respective side trace 13a1 located on the non-display surface 12 through a connecting portion 121c. It can be understood that, a projection of the connecting portion 121c overlaps or partially overlaps with a projection of the end 13aa of the side trace 13a1 that is connected to the connecting portion 121c on the non-display surface 12 of the display panel 10. A single isolation portion 3 is provided between two adjacent connecting portions 121c. For example, a single isolation portion 3 is provided between every two adjacent connecting portions 121c. The isolation portion 3 is made of an insulation material, and the isolation portion 3 and the connecting portion 121c adjacent thereto have a distance d4 therebetween. For example, a ratio of the distance between the isolation portion 3 and the connecting portion 121C adjacent thereto to a distance between the two adjacent connecting portions 3 corresponding to the blocking portion 2 is greater than 1:3.

With continuous reference to FIG. 19B, each first line segment 121a is electrically connected to an end 13aa of a respective side trace 13a1 located on the non-display surface 12 through a connecting portion 121c, and a single isolation portion 3 is provided between two adjacent connecting portions 121c. The isolation portion 3 is made of an insulation material, and the isolation portion 3 and the connecting portion 121c adjacent thereto have a distance therebetween. The distance d4 between the isolation portion 3 and the connecting portion 121c adjacent thereto refers the shortest distance between a projection of a side surface of the isolation portion 3 and a projection of a side surface of the connecting portion 121c adjacent thereto on the non-display surface 12, where the two side surfaces are opposite. A distance between the two adjacent connecting portions 121c is marked as dd'. In some embodiments, the distance dd' between the two adjacent connecting portions 121c is equal to the distance dd between the two adjacent first line segments 121a.

In a case where an isolation portion 3 made of an insulation material is disposed between connecting portions 121c of adjacent first line segments 121a, when the pattern of the side traces 13a1 are formed by using the mask M, due to the existence of the isolation portion 3 and a set distance between the isolation portion 3 and the connecting portion 121c adjacent thereto, a penetrated film layer will be blocked by the isolation portion 3, which prevents penetrated portions of the film layer on both sides of the isolation portion 3 from connecting to each other. In this way, it may effectively prevent the short circuit between first line segments 121a caused by the penetrated film layer, and improve the yield of the display panel. Therefore, the step of using the laser to etch and repair the back traces 121 of the display panel 10 in the later process may be omitted, and the conductive island mm between the side traces 13a1 of the display panel 10 is only needed to be etched by the laser. Through the isolation portion 3 and the blocking portion 2 arranged between the first line segments 121a, it may not only avoid damage to the back traces 121 of the display panel 10 caused by etching and repairing by the laser, but also avoid the short circuit between the connecting portions 121c of the first line segments 121a caused by the penetration of a sputtered coating layer. As a result, the quality of the display panel 10 may be improved.

In some embodiments, with continuous reference to FIG. 19B, in a case where the distance dd' between the two adjacent connecting portions 121c is 65 μm, the distance d4 between the isolation portion 3 and the connecting portion 121c adjacent thereto may be set as 25 μm. By setting the ratio of the distance between the isolation portion 3 and the connecting portion 121c adjacent thereto to the distance between the two adjacent connecting portions 3 corresponding to the blocking portion 2 to be greater than 1:3, it can efficiently prevent the short circuit between the connecting portions 121c of the first line segments 121a caused by the penetration of the sputtered coating layer.

In some embodiments, an end of the isolation portion 3 extends to a boundary between the non-display surface 12 and the selected side surface 13a. With continuous reference to FIG. 19B, the extension direction of the isolation portion 3 is the same as the extension direction of the first line segment 121a. An end of the isolation portion 3 extends to the boundary between the non-display surface 12 and the selected side surface 13a. The isolation portion 3 protects the connecting portion 121c of the first line segment 121a and an extension portion of the side trace 13a1 on the non-display surface 12, which makes a problem of short circuit on the circuit caused by the penetration of the coating layer not occur on the non-display surface 12 of the display panel 10.

Figure 20:
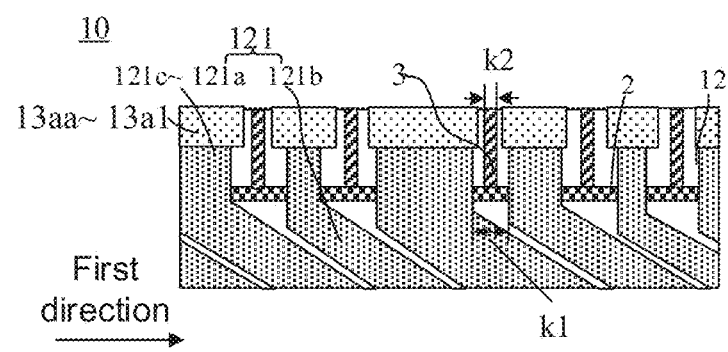
FIG. 20 is a diagram of yet other structures on a non-display surface of a display panel, in accordance with some embodiments of the present disclosure.

In some embodiments, as shown in FIGS. 19B and 20, a blocking portion 2 and an isolation portion 3 that are located between two adjacent first line segments 121a are connected to each other.

In some embodiments, in the case where the blocking portion 2 is made of an insulation material, the blocking portion and the isolation portion that are connected to each other are of an integrated structure. That is, the blocking portion 2 and the isolation portion 3 may be made of the same material, for example, they may be made of the same resin material, and the blocking portion 2 and the isolation portion 3 that are connected to each other may be formed into the integrated structure through a single photolithography process.

In some embodiments, in the case where the blocking portion 2 is made of an insulation material, the blocking portion 2 may be in contact with the first line segments 121a adjacent thereto. The outline of the orthographic projection of the blocking portion 2 on the non-display surface 12 may be in different shapes, for example, it may be in a shape of a rectangle, a square, a trapezoid, or a triangle, which will not be repeated here. As shown in FIG. 20, the blocking portion 2 and the isolation portion 3 that are located between two adjacent first line segments 121a are connected to each other, the blocking portion 2 is in contact with the first line segments 121a adjacent thereto, and the outline of the orthographic projection of the blocking portion 2 on the non-display surface 12 is in a shape of a rectangle.

In some embodiments, with continuous reference to FIG. 20, a width k1 of the blocking portion 2 in the first direction is greater than a width k2 of the isolation portion 3 in the first direction, and the first direction is perpendicular to an extension direction of the first line segment 121a. The width k1 of the blocking portion 2 in the first direction is a dimension of a projection of the blocking portion 2 on the non-display surface 12 in the first direction, and the width k2 of the isolation portion 3 in the first direction is a dimension of a projection of the isolation portion 3 on the non-display surface 12 in the first direction. For example, the blocking portion 2 and the isolation portion 3 may be integrally formed into a T-shaped structure. In a case where the blocking portion 2 is made of an insulation material and is in contact with the first line segments 121a adjacent thereto, the width k1 of the blocking portion 2 in the first direction may be equal to a distance dd between the two first line segments 121a adjacent thereto.

Figure 21:
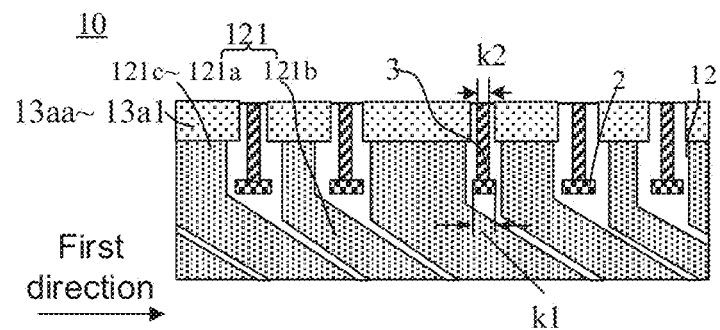
FIG. 21 is a diagram of yet other structures on a non-display surface of a display panel, in accordance with some embodiments of the present disclosure.

In some other embodiments, in the case where the blocking portion 2 is made of an insulation material, the blocking portion 2 may not be in contact with the first line segments 121a adjacent thereto, and the outline of the orthographic projection of the blocking portion 2 on the non-display surface 12 may be in different shapes, for example, it may be in a shape of a rectangle, a square, a trapezoid, or a triangle. The specific content is as described above, which will not be repeated here. As shown in FIG. 21, the blocking portion 2 is made of an insulation material, and a blocking portion 2 and an isolation portion 3 that are located between two adjacent first line segments 121a are connected to each other. The blocking portion 2 is not in contact with the first line segments 121a adjacent thereto, and the outline of the orthographic projection of the blocking portion 2 on the non-display surface 12 is in a shape of a rectangle. A relationship between a width k1 of the blocking portion 2 in a first direction and a width k2 of the isolation portion 2 in the first direction is not specifically limited, where the first direction is perpendicular to an extension direction of the first line segment 121a.

Figure 22:
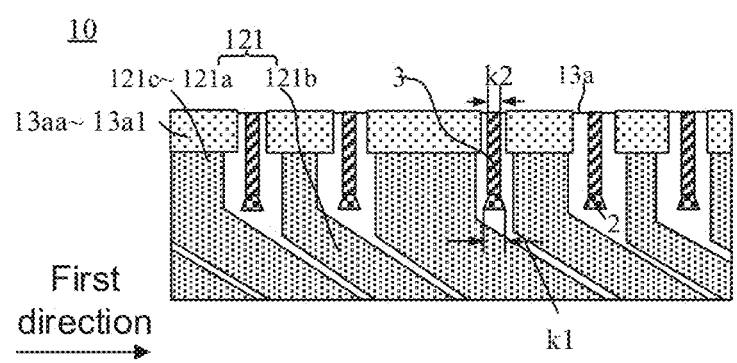
FIG. 22 is a diagram of yet other structures on a non-display surface of a display panel, in accordance with some embodiments of the present disclosure.

In yet some other embodiments, a blocking portion 2 and an isolation portion 3 that are located between two adjacent first line segments 121a are connected to each other. In a case where the blocking portion 2 is made of a metal material, the blocking portion 2 is not in contact with the first line segments 121a adjacent thereto. The blocking portion 2 and the isolation portion 3 that are connected to each other are required to be fabricated separately through two photolithography processes. The outline of the orthographic projection of the blocking portion 2 on the non-display surface 12 is in a shape of a rectangle, a square, a trapezoid, or a triangle. The specific content is as described above, which will not be repeated here. As shown in FIG. 22, the blocking portion 2 is not in contact with first line segments 121a adjacent thereto, and the blocking portion 2 and the isolation portion 3 that are located between the two adjacent first line segments 121a are connected with each other. The outline of the orthographic projection of the blocking portion 2 on the non-display surface 12 is in a shape of a trapezoid, where an upper base of the trapezoid shape is closer to the selected side surface 13a than a lower base thereof. A relationship between the width k1 of the blocking portion 2 in a first direction and the width k2 of the isolation portion 2 in the first direction is not specifically limited, where the first direction is perpendicular to an extension direction of the first line segment 121a.

Figure 23:
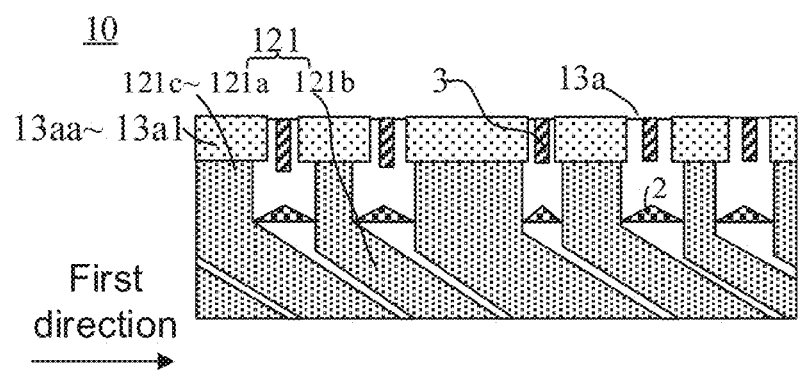
FIG. 23 is a diagram of yet other structures on a non-display surface of a display panel, in accordance with some embodiments of the present disclosure.
Figure 24:
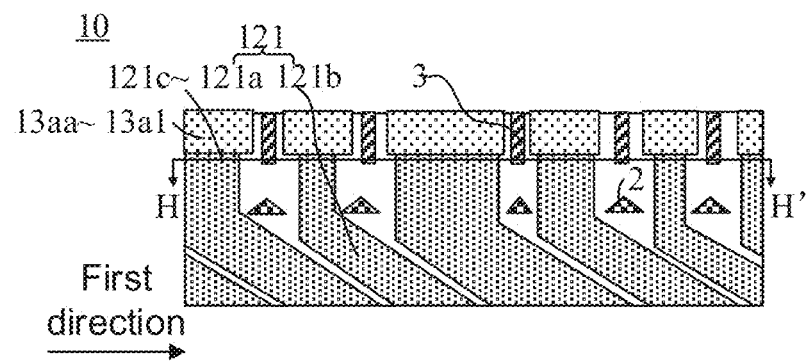
FIG. 24 is a diagram of yet other structures on a non-display surface of a display panel, in accordance with some embodiments of the present disclosure.

In some embodiments, as shown in FIGS. 23 and 24, a blocking portion 2 and an isolation portion 3 that are located between two adjacent first line segments 121a are not in contact with each other.

In some embodiments, in the case where the blocking portion 2 is made of an insulation material, the blocking portion 2 may be in contact with first line segments 121a adjacent thereto, and the blocking portion 2 and the isolation portion 3 that are located between two adjacent first line segments 121a are not in contact with each other. The outline of the orthographic projection of the blocking portion 2 on the non-display surface 12 may be in different shapes, for example, it may be in a shape of a rectangle, a square, a trapezoid, or a triangle, which will not be repeated here. As shown in FIG. 23, the outline of the orthographic projection of the blocking portion 2 on the non-display surface 12 is in the shape of a triangle, where a vertex of the triangle is closer to the selected side surface 13a than an opposite side to which the vertex is opposite. The blocking portion 2 is in contact with the first line segments 121a adjacent thereto, and the blocking portion 2 and the isolation portion 3 that are located between the two adjacent first line segments 121a are not in contact with each other.

In yet some other embodiments, in the case where the blocking portion 2 is made of an insulation material, the blocking portion 2 may not be in contact with first line segments 121a adjacent thereto. The blocking portion 2 and the isolation portion 3 that are located between two adjacent first line segments 121a are not in contact with each other. The outline of the orthographic projection of the blocking portion 2 on the non-display surface 12 may be in different shapes, for example, it may be in a shape of a rectangle, a square, a trapezoid, or a triangle, which will not be repeated here. As shown in FIG. 24, the blocking portion 2 is not in contact with the first line segments 121a adjacent thereto, the blocking portion 2 and the isolation portion 3 that are located between the two adjacent first line segments 121a are not in contact with each other, and the outline of the orthographic projection of the blocking portion 2 on the non-display surface 12 is in the shape of a triangle.

Figure 25:
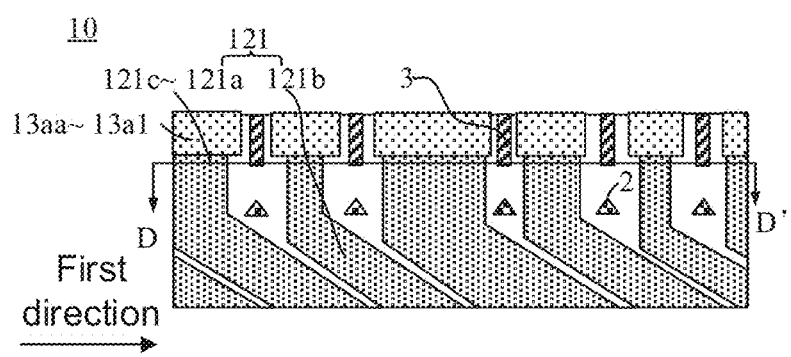
FIG. 25 is a diagram of yet other structures on a non-display surface of a display panel, in accordance with some embodiments of the present disclosure.

In yet some other embodiments, in the case where the blocking portion 2 is made of a metal material, the blocking portion 2 is not in contact with first line segments 121a adjacent thereto. The blocking portion 2 and the isolation portion 3 that are located between two adjacent first line segments 121a are not in contact with each other. The outline of the orthographic projection of the blocking portion 2 on the non-display surface 12 may be in different shapes, for example, it may be in a shape of a rectangle, a square, a trapezoid, or a triangle, which will not be repeated here. As shown in FIG. 25, the blocking portion 2 is not in contact with the first line segments 121a adjacent thereto, the blocking portion 2 and the isolation portion 3 that are located between the two adjacent first line segments 121a are not in contact with each other, and the outline of the orthographic projection of the blocking portion 2 on the non-display surface 12 is in the shape of a triangle.

Figure 26:
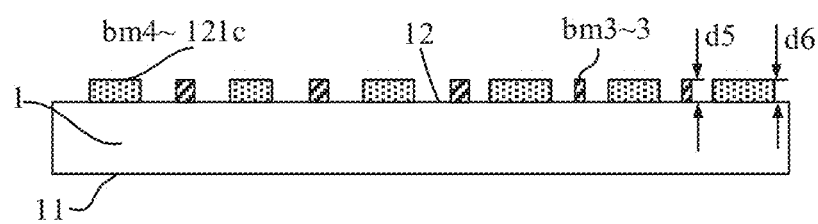
FIG. 26 is a cross-sectional structural view of the display panel along the section line DD' shown in FIG. 25, in accordance with some embodiments of the present disclosure.
Figure 27:
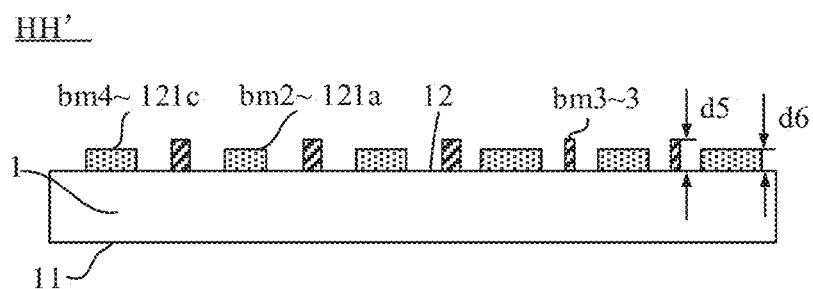
FIG. 27 is a cross-sectional structural view of the display panel along the section line HH' shown in FIG. 24, in accordance with some embodiments of the present disclosure.

In some embodiments, as shown in FIGS. 26 and 27, a distance d5 between a surface bm3 of the isolation portion 3 away from the non-display surface 12 and the non-display surface 12 is greater than or equal to a distance d6 between a surface bm4 of the connecting portion 121c away from the non-display surface 12 and the non-display surface 12.

When the pattern of the side traces 13a1 is formed by using the mask M, since the distance d5 between the surface bm3 of the isolation portion 3 away from the non-display surface 12 and the non-display surface 12 is greater than or equal to the distance d6 between the surface bm4 of the connecting portion 121c away from the non-display surface 12 and the non-display surface 12, the mask M is closely attached to the isolation portion 3, which may effectively block the penetration of the coating layer, and further improve the blocking effect of the isolation portion 3. As a result, the yield of the display panel is improved.

In some examples, as shown in FIG. 26, the distance d5 between the surface bm3 of the isolation portion 3 away from the non-display surface 12 and the non-display surface 12 is equal to the distance d6 between the surface bm4 of the connecting portion 121c away from the non-display surface 12 and the non-display surface 12.

In some examples, as shown in FIG. 27, the distance d5 between the surface bm3 of the isolation portion 3 away from the non-display surface 12 and the non-display surface 12 is greater than the distance d6 between the surface bm4 of the connecting portion 121c away from the non-display surface 12 and the non-display surface 12. In some embodiments, the surface bm4 of the connecting portion 121c away from the non-display surface 12 and a portion, other than the surface bm4, of the surface bm2 of the first line segment 121a away from the non-display surface 12 may be on a same plane.

Figure 28:
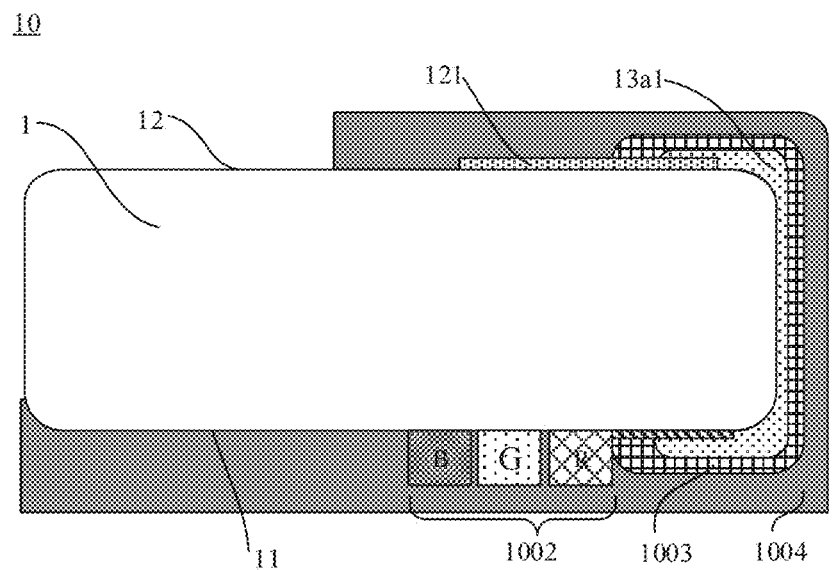
FIG. 28 is a structural diagram of a display panel, in accordance with some embodiments of the present disclosure.

In some embodiments, as shown in FIG. 28, the display panel 10 includes a plurality of light-emitting devices 1002 arranged on the display surface. For example, the light-emitting devices may be Micro LED chips or mini LED chips.

As shown in FIG. 28, the display panel 10 further includes a first protective layer 1003 and a second protective layer 1004. The first protective layer 1003 covers the plurality of side traces 13a1, that is, the first protective layer 1003 is arranged on a side of the plurality of side traces 13a1 away from the backplane 1. For example, the first protective layer 1003 may fill gap regions between the plurality of side traces 13a1 and cover surfaces of the plurality of side traces 13a1. The first protective layer 1003 plays a role of electrical insulation and water-oxygen corrosion resistance, and prevents the plurality of side traces 13a1 from external damage that may cause problems such as peeling, disconnection, and oxidation, thereby prolonging the service life of the display panel 10. From the cross-sectional view of the display panel 10, the plurality of side traces 13a1 are U-shaped, and the first protective layer 1003 is also U-shaped.

The second protective layer 1004 is arranged on a side of the first protective layer 1003 away from the side trace 13a1, and the second protective layer 1004 covers film layers on the display surface 11 of the display panel 10, the first protective layer 1003, the back traces 121, etc. The second protective layer 1004 may further protect the plurality of side traces, and protect the traces on the display surface 11 and the back traces 121.

In some embodiments, a portion of the second protective layer 1004 located on the display surface 11 may be a black glue layer. For example, a material of the black glue layer is black silica gel or black resin. In some embodiments, a portion of the black glue layer covering the plurality of light-emitting devices is thinner than the other portions, which will not affect a light-emitting effect of the light-emitting devices while protecting the film layers of the display surface.

In order to prevent the etching damage caused by the laser LASER on the back trace 121 of the display panel 10 when a laser etching process is adopted to pattern the metal layer into the plurality of side traces and when the laser LASER is used to repair the side traces 13a1 of the display panel 10, an alternative solution may be adopted.

Figure 30:
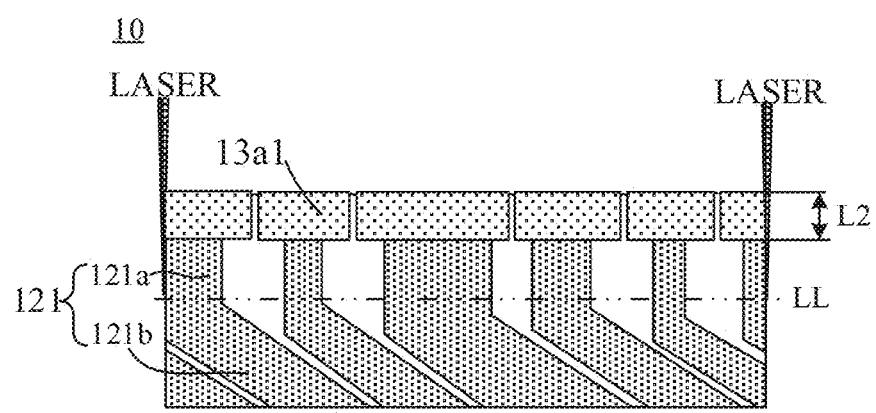
FIG. 30 is a plan structural diagram of a display panel etched by laser, in accordance with some embodiments of the present disclosure.

As shown in FIG. 30, some embodiments of the present disclosure further provide another display panel, including a backplane 1, a plurality of back traces 121 and a plurality of side traces 13a1. The specific structures of the backplane 1, the plurality of back traces 121 and the plurality of side traces 13a1 are as described above, which will not be repeated here. A connection position of the first line segment 121a and the second line segment 121b of each of the plurality of back traces 121 is away from a range that can be covered by the laser focal depth when the laser etches the plurality of side traces 13a1.

By lengthening the first line segment 121a on the non-display surface 12 of the display panel 10, a position where the first line segment 121a and the second line segment 121b are connected is away from the range involved by the laser focal depth, it may effectively avoid damage to the back trace when the side traces 131a are formed by using the laser etching.

Figure 29:
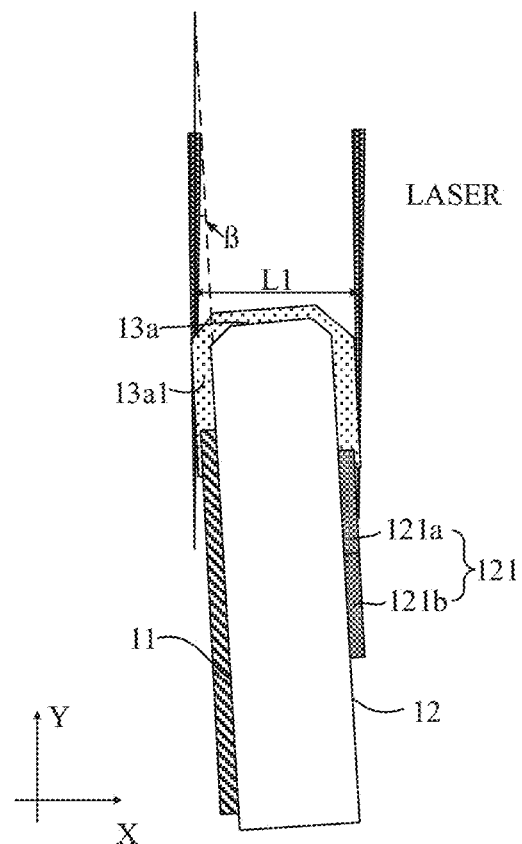
FIG. 29 is a side view of a display panel etched by laser, in accordance with some embodiments of the present disclosure.

In some embodiments, as shown in FIGS. 29 and 30, an irradiation direction of the laser LASER is parallel to the Y axis, and a moving path L1 of the laser is parallel to the X axis. In the laser etching process, the display panel 10 is rotated by a certain angle. For example, there is an included angle β between the display surface 11 of the display panel 10 and the Y axis, and an included angle (90 degrees+β) between the display surface 11 of the display panel 10 and the X axis. β is not more than 3 degrees, for example, it may be 1 degree, so that the film layer on the display surface 11 of the display panel 10 will not be irradiated by the laser. In this way, damage to the film layer of the display surface 11 may be avoided, which ensures the reliability of the display surface 11. By lengthening the first line segment 121a of the back trace 121 of the display panel 10, the position where the first line segment 121a and the second line segment 121b are connected is away from the range involved by the laser focal depth when the laser etches the plurality of side traces 13a1, that is, the position where the first line segment 121a and the second line segment 121b are connected is away from a border LL that can be irradiated by the laser LASER on the non-display surface 12 of the display panel 10, the second line segment 121b will not be irradiated and damaged by the laser. In this way, the film layers on both the display surface 11 and the non-display surface of the display panel 10 may be protected from laser damage.

With continuous reference to FIGS. 29 and 30, the border LL that can be irradiated by the laser LASER on the non-display surface 12 of the display panel 10 refers to a border that can be irradiated by the laser LASER and is farthest from the boundary between the non-display surface 12 and the selected side surface 13a. A position of the border LL is related to the angle β and a size range L1 of the laser LASER in its moving direction X. For example, the moving direction X of the laser LASER is perpendicular to its light-emitting direction Y.

The moving size range L1 of the laser LASER in the moving direction X is related to a length L2 of the end of the side trace 13a1 on the non-display surface 12.

Therefore, through the length L2 of the end of the side trace 13a1 on the non-display surface 12, the moving size range L1 of the laser LASER in the moving direction X is determined. Through the moving size range L1 of the laser LASER in the moving direction X and the angle β, the border LL that can be irradiated by the laser LASER on the non-display surface 12 of the display panel 10 is determined. A region between the border LL and the boundary between the non-display surface 12 and the selected side surface 13a is within the range that can be covered by the laser focal depth; while a side, away from the boundary between the non-display surface 12 and the selected side surface 13a, of the border LL is within a range that cannot be covered by the laser focal depth. The position where the first line segment 121a and the second line segment 121b are connected is arranged within the range that cannot be covered by the laser focal depth. That is, the border LL is away from a region of the boundary between the non-display surface 12 and the selected side surface 13a. In this way, it can avoid damage to the back trace 121 when the laser LASER etches or repairs the side trace 13a1.

In some embodiments, for the solution of arranging the blocking portion 2 to avoid laser damage shown in FIG. 19B, the arrangement position of the blocking portion 2 is related to the range that can be covered by the laser focal depth. In some embodiments, the blocking portion 2 may be arranged in the range that can be covered by the laser focal depth, so as to further protect the back trace 121.

Figure 31:
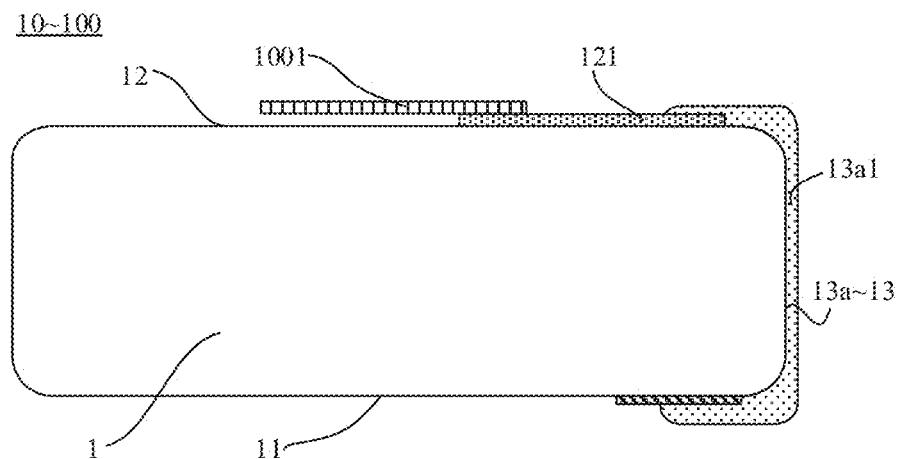
FIG. 31 is a structural diagram of a display device, in accordance with some embodiments of the present disclosure.

In another aspect, a display device 100 is provided. As shown in FIG. 31, the display device 100 includes the display panel 10, and further includes a driving circuit 1001. The driving circuit 1001 is electrically connected to the back traces 121.

In some embodiments, the driving circuit 1001 is electrically connected to the back traces 121 through a flexible circuit board.

The beneficial effects that can be achieved by the display device 100 provided in the present disclosure are the same as the beneficial effects that can be achieved by the embodiments of the display panel 10 provided in the first aspect of the present disclosure, which will not be repeated here.

Figure 32:
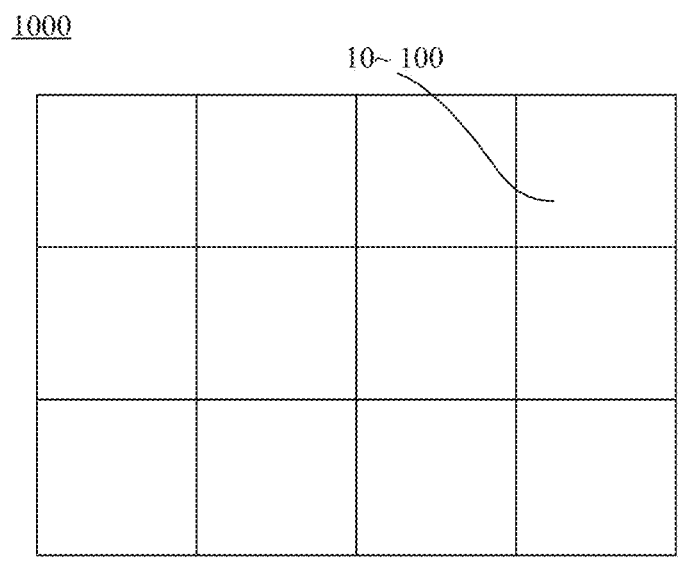
FIG. 32 is a plan structural diagram of a tiled display apparatus, in accordance with some embodiments of the present disclosure.

In yet another aspect, a tiled display device 1000 is provided. As shown in FIG. 32, the tiled display device 1000 includes a plurality of display devices 100 as described above, and the plurality of display devices 100 are assembled to form the tiled display device 1000.

The beneficial effects that can be achieved by the tiled display device 1000 provided in the present disclosure are the same as the beneficial effects that can be achieved by the embodiments of the display panel 10 provided in the first aspect of the present disclosure, which will not be repeated here.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display panel, comprising:
a backplane, the backplane including a display surface, a non-display surface, and a plurality of side surfaces connected to the display surface and the non-display surface, and a side surface of the plurality of side surfaces being a selected side surface;
a plurality of back traces arranged on the non-display surface at intervals, each back trace including a first line segment and a second line segment, and an extension direction of the second line segment intersecting an extension direction of the first line segment;
a plurality of side traces arranged on the selected side surface at intervals, an end of each side trace being located on the display surface, and another end of each side trace being located on the non-display surface; each side trace being electrically connected to a first line segment in the respective back trace of the plurality of back traces, and an extension direction of the first line segment in the respective back trace being same as an extension direction of the another end of each side trace located on the non-display surface; and
a plurality of blocking portions arranged on the non-display surface, two adjacent first line segments being provided with a blocking portion of the plurality of blocking portions therebetween.

2. The display panel according to claim 1, wherein a material of the blocking portion includes an insulation material.

3. The display panel according to claim 2, wherein the material of the blocking portion includes a resin.

4. The display panel according to claim 1, wherein the blocking portion is in contact with a first line segment of the two adjacent first line segments.

5. The display panel according to claim 1, wherein a material of the blocking portion includes a metal material;

the blocking portion and a first line segment of the two adjacent first line segments have a distance therebetween.

6. The display panel according to claim 5, wherein a ratio of the distance between the blocking portion and the first line segment adjacent thereto to a distance between the two adjacent first line segments is greater than 1:3.

7. The display panel according to claim 5, wherein the material of the blocking portion includes at least one of copper, aluminum, silver and gold.

8. The display panel according to claim 1, wherein a distance between a surface of the blocking portion away from the non-display surface and the non-display surface is greater than a distance between a surface of the first line segment away from the non-display surface and the non-display surface.

9. The display panel according to claim 8, wherein the distance between the surface of the blocking portion away from the non-display surface is 0.4 μm to 0.6 μm greater than the distance between the surface of the first line segment away from the non-display surface and the non-display surface.

10. The display panel according to claim 1, wherein an outline of an orthographic projection of the blocking portion on the non-display surface is in a shape of a rectangle, a square, a trapezoid, or a triangle.

11. The display panel according to claim 1, further comprising a plurality of isolation portions arranged on the non-display surface;
wherein the another end of each side trace located on the non-display surface is electrically connected to a connecting portion, proximate to the selected side surface, of the first line segment in the respective back trace; two adjacent connecting portions of the two adjacent first line segments are provided with an isolation portion of the plurality of isolation portions therebetween, the isolation portion is made of an insulation material, and the isolation portion and a connecting portion of the two adjacent connecting portions have a distance therebetween.

12. The display panel according to claim 11, wherein a ratio of the distance between the isolation portion and the connecting portion adjacent thereto to a distance between the two adjacent connecting portions is greater than 1:3.

13. The display panel according to claim 11, wherein the isolation portion extends to a boundary between the non-display surface and the selected side surface.

14. The display panel according to claim 11, wherein a distance between a surface of the blocking portion away from the non-display surface and the non-display surface is greater than or equal to a distance between a surface of the first line segment away from the non-display surface and the non-display surface.

15. The display panel according to claim 14, wherein the blocking portion and the isolation portion located between the two adjacent first line segments are connected to each other.

16. The display panel according to claim 15, wherein the blocking portion is made of an insulation material, and the blocking portion and the isolation portion that are connected to each other are of an integrated structure.

17. The display panel according to claim 15, wherein a width of the blocking portion in a first direction is greater than a width of the isolation portion in the first direction, and the first direction is perpendicular to the extension direction of the first line segment.

18. The display panel according to claim 11, wherein the blocking portion and the isolation portion located between the two adjacent first line segments are not in contact with each other.

19. A display device, comprising the display panel according to claim 1.

20. A tiled display apparatus, comprising a plurality of display devices each according to claim 19, the plurality of display devices being tiled together.

* * * * *